United States Patent
Lin et al.

(10) Patent No.: US 8,853,083 B2
(45) Date of Patent: Oct. 7, 2014

(54) CHEMICAL MECHANICAL POLISH IN THE GROWTH OF SEMICONDUCTOR REGIONS

(71) Applicant: Taiwan Semiconductor Manufacturing Company, Ltd., Hsin-Chu (TW)

(72) Inventors: Kuo-Yin Lin, Jhubei (TW); Wan-Chun Pan, Hsin-Chu (TW); Hsiang-Pi Chang, New Taipei (TW); Teng-Chun Tsai, Tainan (TW); Chi-Yuan Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/748,363

(22) Filed: Jan. 23, 2013

(65) Prior Publication Data

US 2014/0206164 A1     Jul. 24, 2014

(51) Int. Cl.
*H01L 21/302* (2006.01)
(52) U.S. Cl.
USPC .......................................................... 438/692

(58) Field of Classification Search
USPC .......................................................... 438/692
See application file for complete search history.

(56) References Cited

U.S. PATENT DOCUMENTS

| | | | |
|---|---|---|---|
| 5,670,409 A * | 9/1997 | Otori et al. | 438/211 |
| 7,271,100 B2 * | 9/2007 | Lee et al. | 438/691 |
| 2006/0157080 A1 * | 7/2006 | Tsai et al. | 134/3 |

* cited by examiner

*Primary Examiner* — Reema Patel
(74) *Attorney, Agent, or Firm* — Slater & Matsil, L.L.P.

(57) ABSTRACT

A method includes performing a first planarization step to remove portions of a semiconductor region over isolation regions. The first planarization step has a first selectivity, with the first selectivity being a ratio of a first removal rate of the semiconductor region to a second removal rate of the isolation regions. After the isolation regions are exposed, a second planarization step is performed on the isolation regions and a portion of the semiconductor region between the isolation regions. The second planarization step has a second selectivity lower than the first selectivity, with the second selectivity being a ratio of a third removal rate of the portion of semiconductor region to a fourth removal rate of the isolation regions.

20 Claims, 10 Drawing Sheets

CHEMICAL MECHANICAL POLISH IN THE GROWTH OF SEMICONDUCTOR REGIONS

BACKGROUND

The speed of Metal-Oxide-Semiconductor (MOS) transistors is closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Compound semiconductor materials of group III and group V elements (referred to as III-V compound semiconductors hereinafter) are good candidates for forming transistors due to their high electron mobility. Therefore, III-V based transistors have been explored. III-V compound semiconductor films, however, need to be grown on other substrates because it is difficult to obtain bulk III-V crystals. The growth of III-V compound semiconductor films on dissimilar substrates faces difficulties because these substrates have lattice constants and thermal expansion coefficients different than that of the III-V compound semiconductors. Various methods have been used to form high quality III-V compound semiconductors. For example, III-V compound semiconductors were grown from trenches between shallow trench isolation regions to reduce the number of threading dislocations.

The formation of III-V compound semiconductors from trenches typically includes an epitaxy growth, followed by a Chemical Mechanical Polish (CMP) to remove excess III-V compound semiconductors over the shallow trench isolation regions. The profile of the resulting structure, however, is difficult to control. Step heights, which are the height differences between the top surfaces of shallow trench isolation regions and the top ends of the III-V compound semiconductors, are high. Furthermore, the III-V compound semiconductors may have a significant dishing effect.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A novel method for growing semiconductor regions from trenches is provided in accordance with exemplary embodiments. The intermediate stages of growing the semiconductor regions in accordance with exemplary embodiments are illustrated. Throughout the various views and illustrative embodiments, like reference numbers are used to designate like elements.

Figure 1:
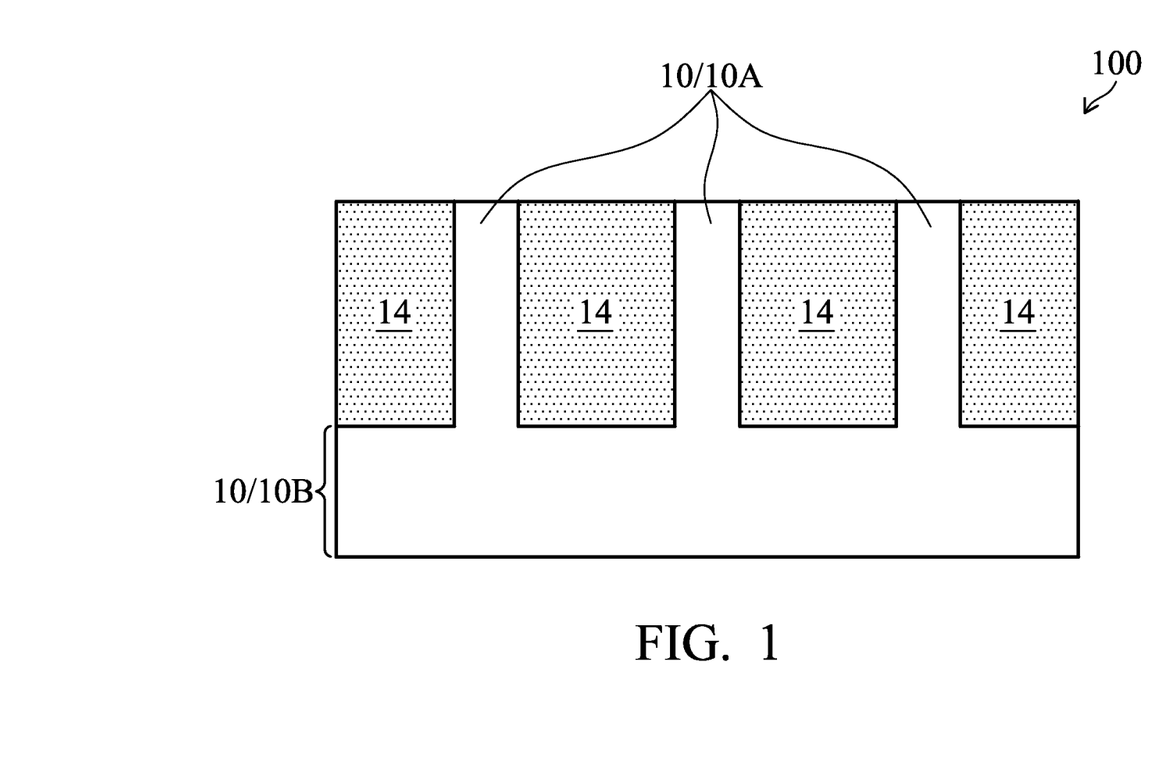
FIGS. 1 through 8 are cross-sectional views of intermediate stages in the manufacturing of semiconductor fins and the respective Fin Field-Effect Transistor (FinFET) in accordance with some exemplary embodiments.

FIGS. 1 through 8 illustrate the cross-sectional views of intermediate stages in the formation of a semiconductor fin and a Fin Field-Effect Transistor (FinFET) in accordance with exemplary embodiments. Referring to FIG. 1, substrate 10, which is a part of semiconductor wafer 100, is provided. Substrate 10 may be a silicon substrate, although it may also be formed of other materials such as germanium, SiC, SiGe, GaAs, sapphire, or the like. Isolation regions such as Shallow Trench Isolation (STI) regions 14 are formed in substrate 10. Substrate 10 thus includes portions 10A between STI regions 14, and portions 10B under STI regions 14. The formation process of STI regions 14 may include etching substrate 10 to form recesses, filling the recesses with a dielectric material (s), and performing a planarization to remove excess dielectric materials. The remaining portions of the dielectric material(s) form STI regions 14. In some embodiments, STI regions 14 comprise silicon oxide.

Figure 2:
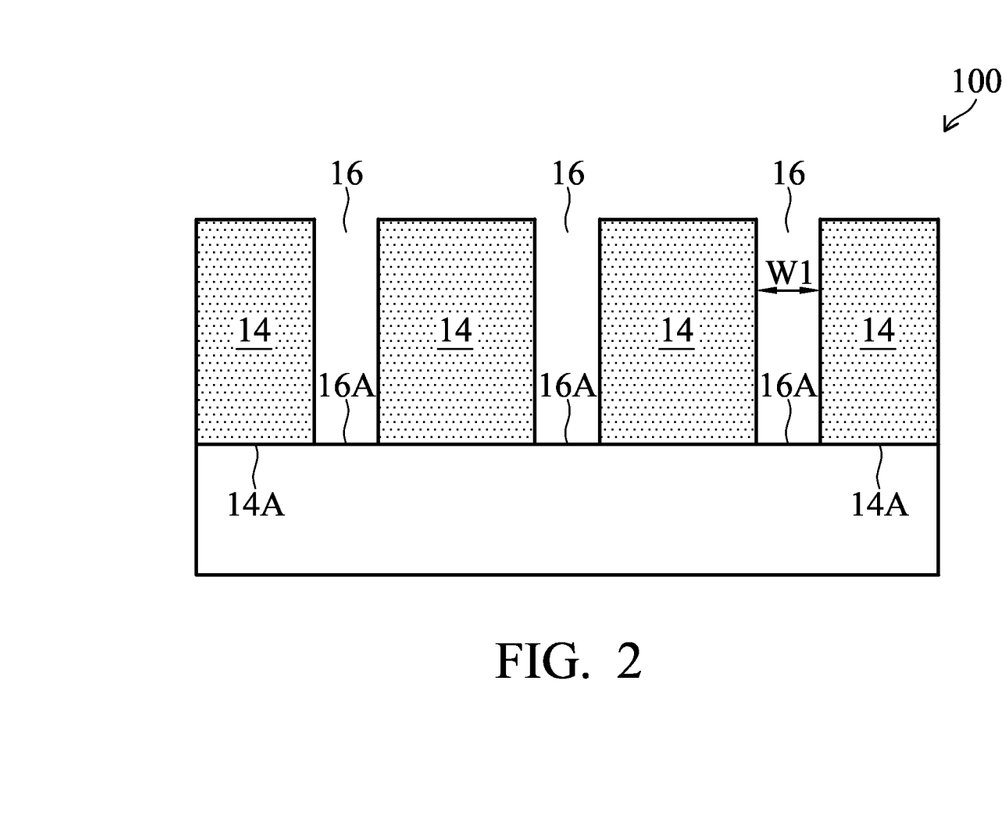

Next, as shown in FIG. 2, portions 10A of substrate 10, which portions 10A are between opposite sidewalls of STI regions 14, are etched to form trenches 16. In some embodiments, bottoms 16A of trenches 16 are substantially level with bottom surfaces 14A of STI regions 14. In alternative embodiments, bottoms 16A of trenches 16 are higher than or lower than bottom surfaces 14A of STI regions 14. The etching may be performed using dry etch, with the etching gas selected from $CF_4$, $Cl_2$, $NF_3$, $SF_6$, and combinations thereof. In alternative embodiments, the etching may be performed using wet etching, for example, using Tetra-Methyl Ammonium Hydroxide (TMAH), a potassium hydroxide (KOH) solution, or the like, as an etchant. In the resulting structure, trenches 16 may have widths W1 smaller than about 150 nm, smaller than about 100 nm, or smaller than about 50 nm.

Figure 3:
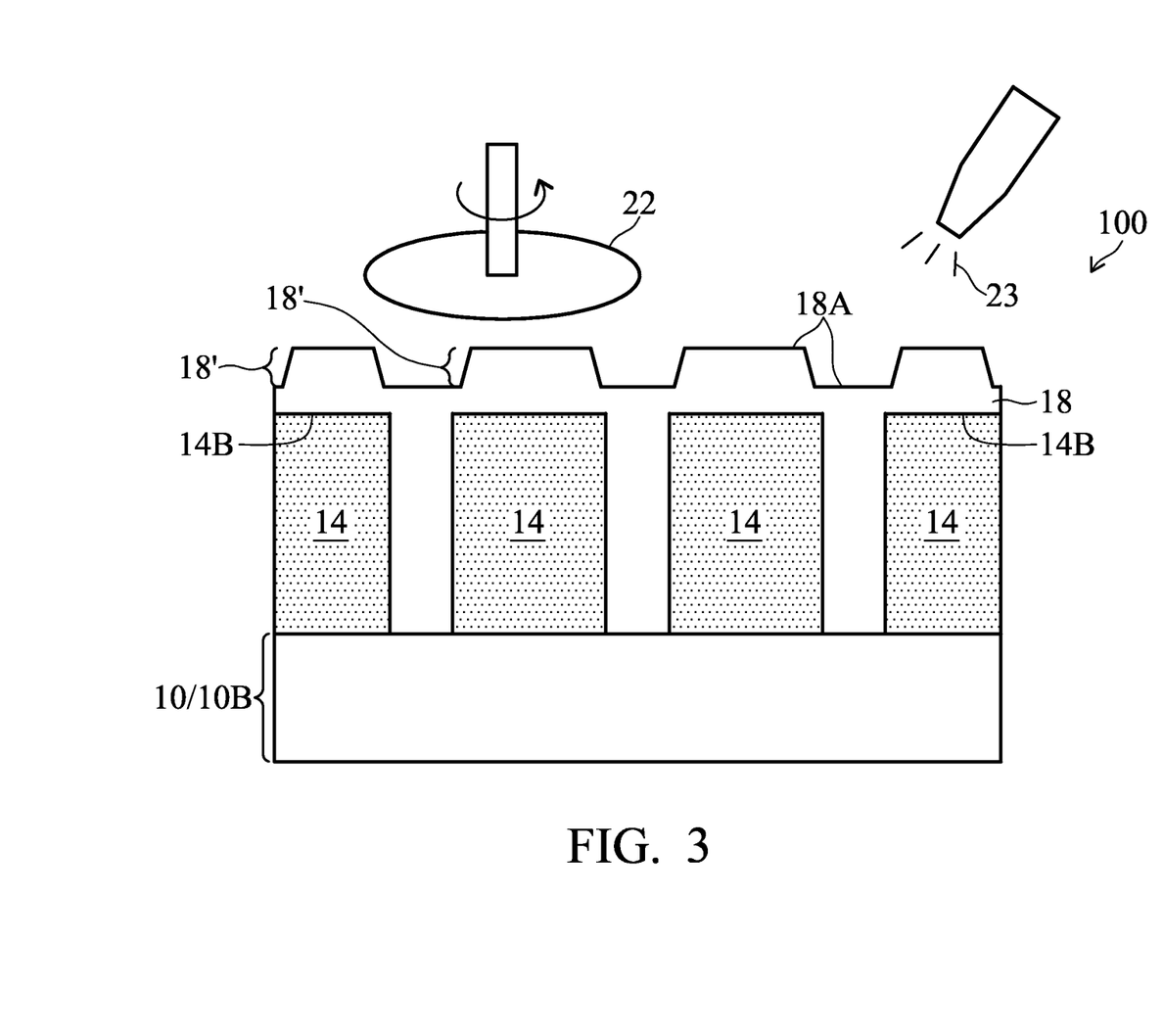

FIG. 3 illustrates the epitaxy of semiconductor region 18. Semiconductor region 18 is epitaxially grown from the exposed surfaces of semiconductor substrate 10, which exposed surfaces are exposed to trenches 16 (FIG. 2). In some embodiments, semiconductor region 18 comprises silicon germanium, with the atomic percentage of germanium greater than zero percent, and equal to or smaller than 100 percent. When the atomic percentage of germanium is 100 percent, semiconductor region 18 is formed of pure germanium. In alternative embodiments, semiconductor region 18 comprises a III-V compound semiconductor material selected from InAs, AlAs, GaAs, InP, GaN, InGaAs, InAlAs, GaSb, AlSb, AlP, GaP, and combinations thereof. Semiconductor region 18 may be a homogenous region, with the bottom portions and top portions formed of a same material. Semiconductor region 18 may also be a composite region, with bottom portions and top portions comprising different materials or having different compositions. For example, the upper portions of semiconductor region 18 may have greater lattice mismatch than lower portions. In some embodiments, semiconductor region 18 comprises silicon germanium, with the upper portions having greater germanium percentages than lower portions.

Figure 4:
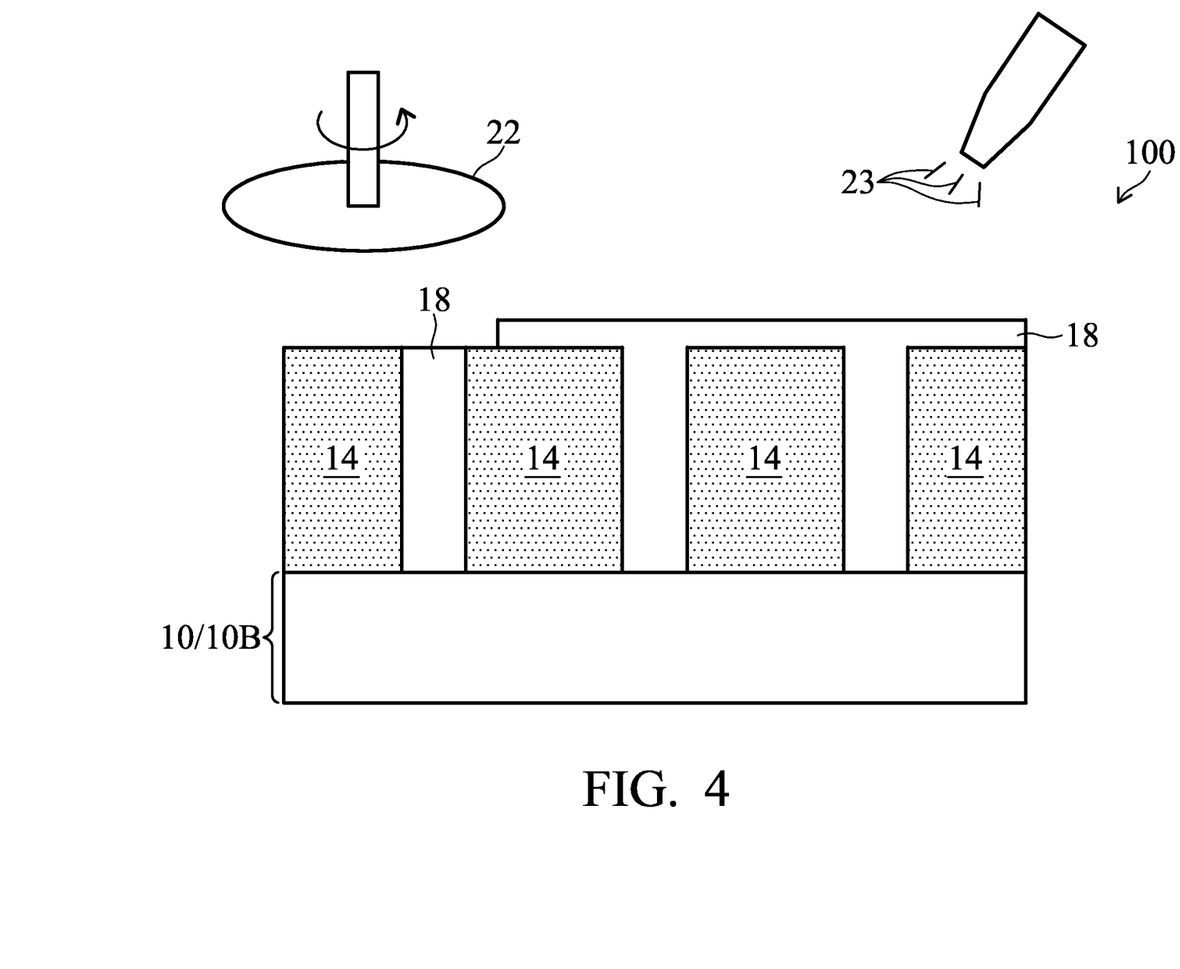
Figure 5:
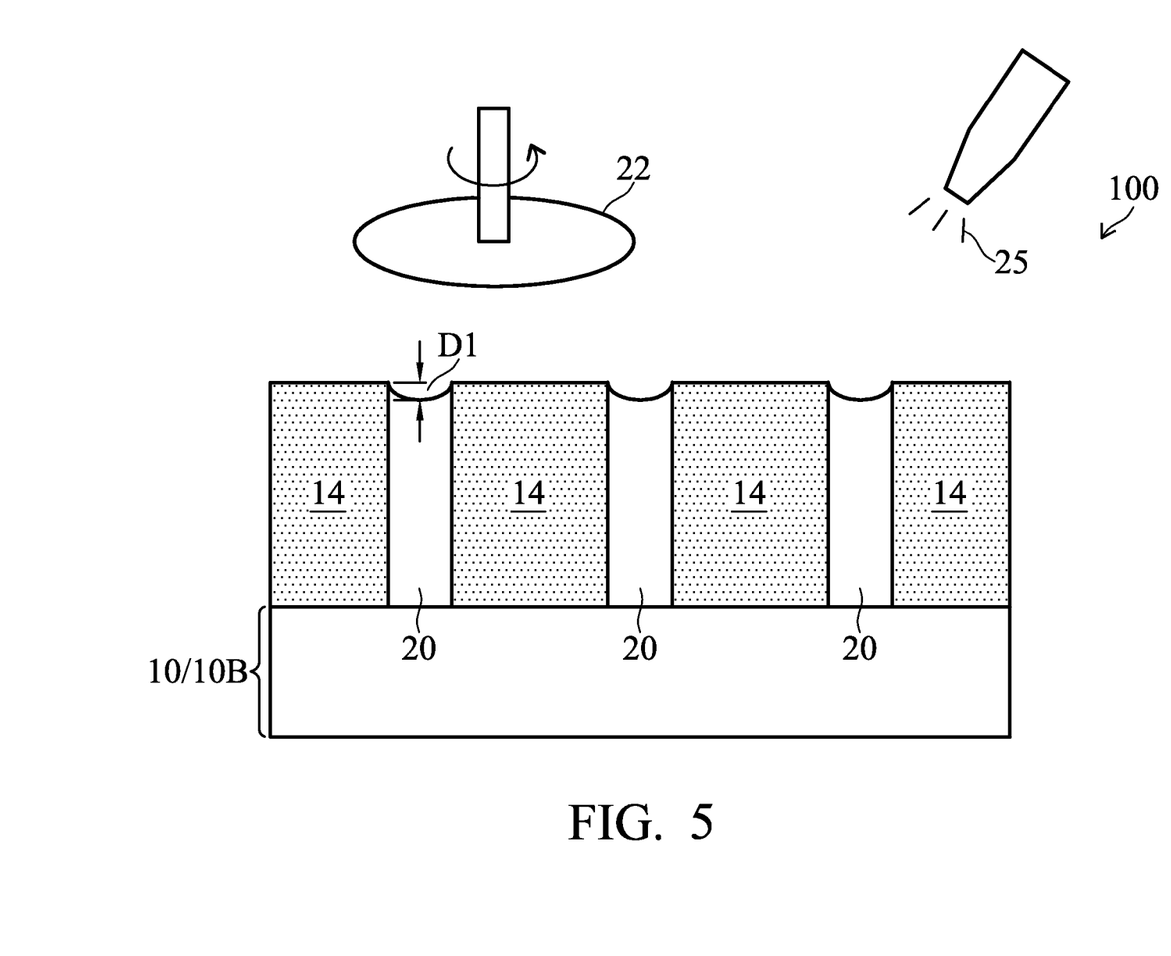

The epitaxy is continued until the top surfaces 18A of semiconductor region 18 are higher than top surfaces 14B of STI regions 14. A first planarization is then performed, as shown in FIGS. 3 through 5. In some embodiments, the first planarization comprises a Chemical Mechanical Polish (CMP), wherein polish pad 22 is used to polish semiconductor region 18 with the help of slurry 23, which is dispensed on the polished surface of semiconductor region 18. As shown in FIG. 5, the first planarization is continued until no semiconductor region 18 is left overlapping STI regions 14. The portions of semiconductor region 18 between STI regions 14, however, remain after the first planarization, and are referred to as semiconductor strips 20 hereinafter.

The first planarization is performed with a first selectivity between the removal rate of semiconductor region 18 and the removal rate of STI regions 14, with the removal rate of semiconductor region 18 greater than the removal rate of STI regions 14. Assuming the removal rate of semiconductor region 18 is RR1, and the removal rate of STI regions 14 is RR2, the first selectivity, which is RR1/RR2, may be greater than about 10, and may also be between about 10 and about 100 in some exemplary embodiments. It is appreciated, however, that the values recited throughout the description are merely examples, and may be changed to different values. For example, first selectivity RR1/RR2 may also be smaller than about 10 and greater than 1. In some embodiments, the slurry 23 used in the first planarization may comprise $Al_2O_3$, $SiO_2$, $H_2O_2$, and the like.

Figure 9:
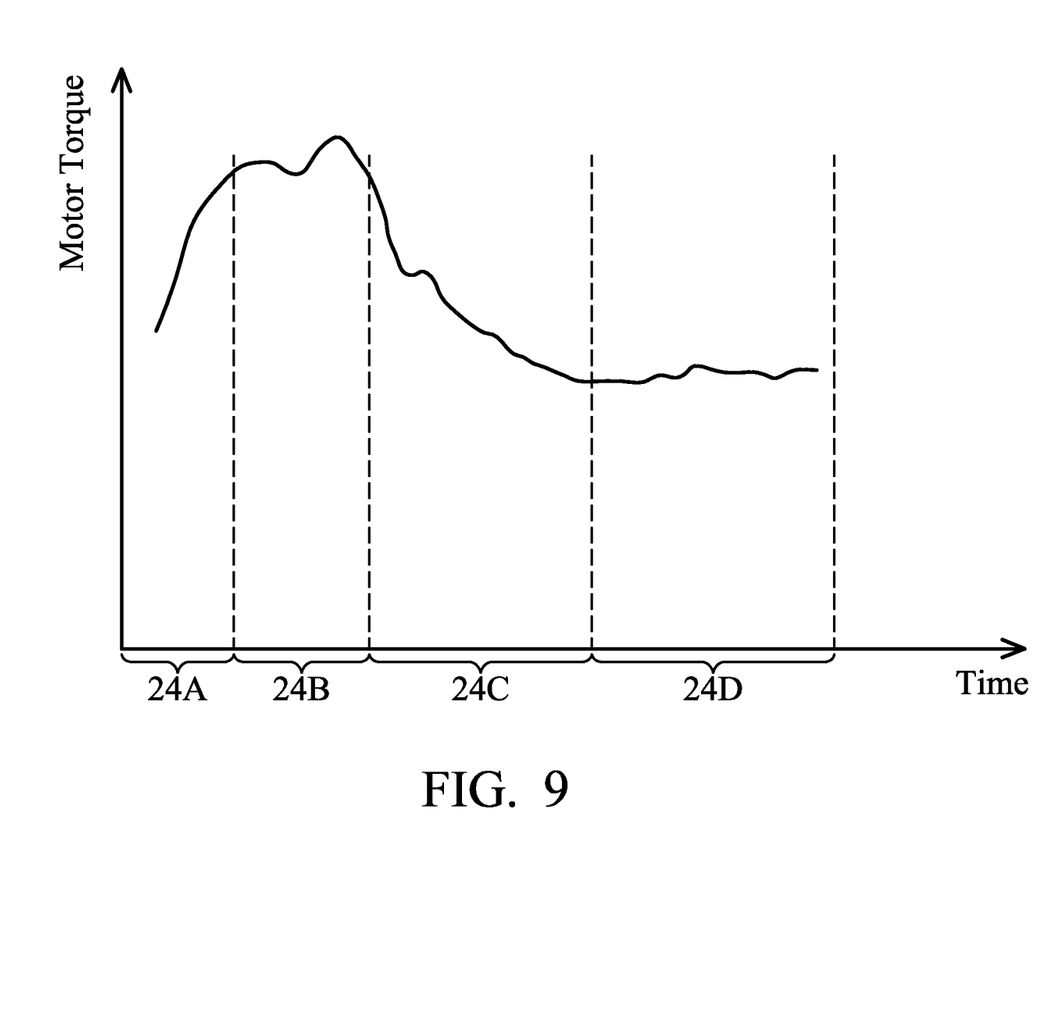
FIG. 9 illustrates the motor torque in the polishing of a semiconductor material as a function of time in accordance with some alternative exemplary embodiments.

The stop point of the first planarization may be determined by monitoring the motor torque of the polish pad 22. FIG. 9 schematically illustrates the change of the motor torque when the first planarization proceeds. The Y axis illustrates the motor torque, and the X axis illustrates the time of the first planarization. Stage 24A in FIG. 9 represents the polish stage wherein the protruding portions 18' (FIG. 3) have not been fully removed. During this stage, with the proceeding of the polish, more and more protruding portions 18' are removed. As a result, the contact area of polish pad 22 to semiconductor region 18 increases, and the friction increases, resulting in the monitored motor torque to increase. In stage 24B in FIG. 9, portions 18' have been removed, the motor torque peaks, and remains substantially stable, until STI regions 14 (FIG. 4) starts to be exposed. The friction between polish pad 22 and STI regions 14 is smaller than the friction between polish pad 22 and semiconductor regions 18. Accordingly, with more and more STI regions 14 exposed, the motor torque becomes increasingly smaller, as shown in stage 24C in FIG. 9. When all STI regions 14 are exposed, the motor torque again becomes stable, as shown in stage 24D. Accordingly, by finding when the motor torque enters into stage 24D, the optimum stop point of the first planarization may be determined. When the stop point of the first planarization is found, which is when all top surfaces of STI regions 14 are exposed, the first planarization is stopped.

Referring back to FIG. 5, since first selectivity RR1/RR2 is high, semiconductor strips 20 have dishing effect, which means that the top surfaces of semiconductor strips 20 are low in the middle line of the neighboring STI regions 14, and are higher close to STI regions 14. In some exemplary embodiments, the magnitude of dishing (also referred to as dishing value) D1 is between about 50 nm and about 10 nm. Dishing value D1 is the height difference between the highest point and the lowest point of the top surfaces of semiconductor strip 20. High selectivity RR1/RR2 helps to stop the first planarization accurately on the top surfaces of STI regions 14. High selectivity RR1/RR2, however, may result in more severe dishing effect.

Next, as shown in FIG. 5, after STI regions 14 are exposed, and the first planarization is stopped, a second planarization is performed, which is alternatively referred to as a buff (polish) process. In the second planarization, the removal rate of semiconductor strips 20 is RR1', and the removal rate of STI regions 14 is RR2'. The second selectivity of the second planarization is thus RR1'/RR2'. The second selectivity RR1'/RR2' is smaller than the first selectivity RR1/RR2. In accordance with exemplary embodiments, selectivity difference RR1/RR2−RR1'/RR2' may be greater than 2, greater than 5, and may be greater than 10. In some embodiments, slurry 25 that is used in the second planarization is different from slurry 23 (FIGS. 3 and 4), which is used in the first planarization. For example, slurry 25 may comprise $SiO_2$, KOH, $H_2O_2$, and the like.

Figure 6:
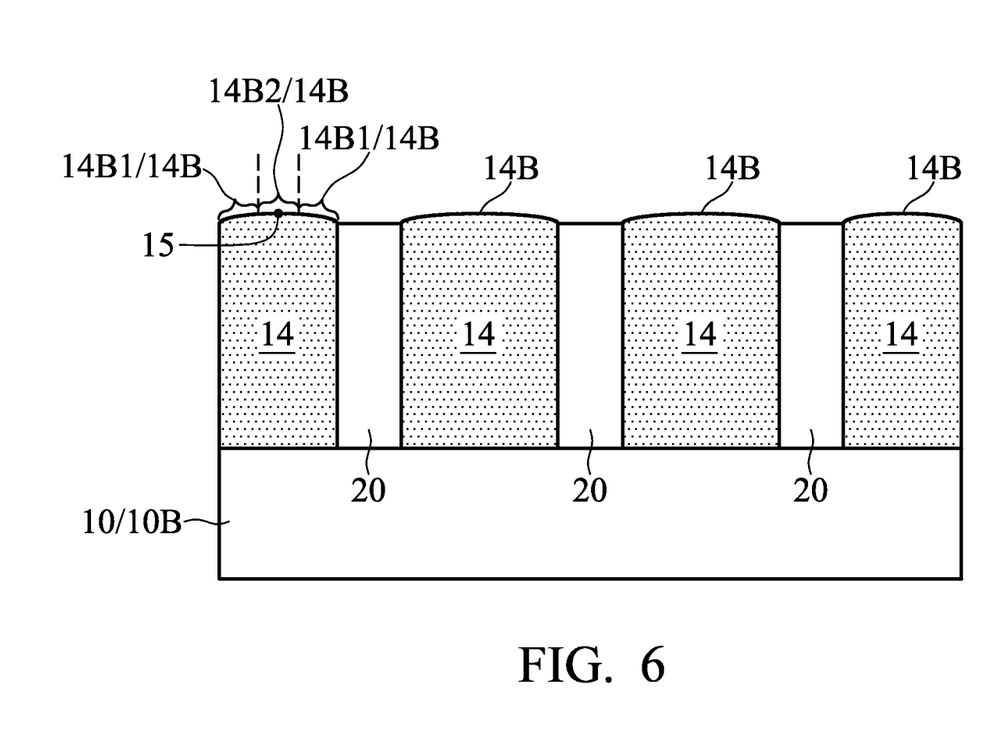

With the second selectivity RR1'/RR2' smaller than the first selectivity RR1/RR2, in the second planarization, STI regions 14 are removed relatively faster than in the first planarization. The dishing as shown in FIG. 5 is at least reduced, and may be substantially eliminated. The resulting structure obtained when the second planarization is finished is shown in FIG. 6. In some exemplary embodiments, the dishing of semiconductor strips 20, if any, is smaller than about 10 nm.

Figure 7:
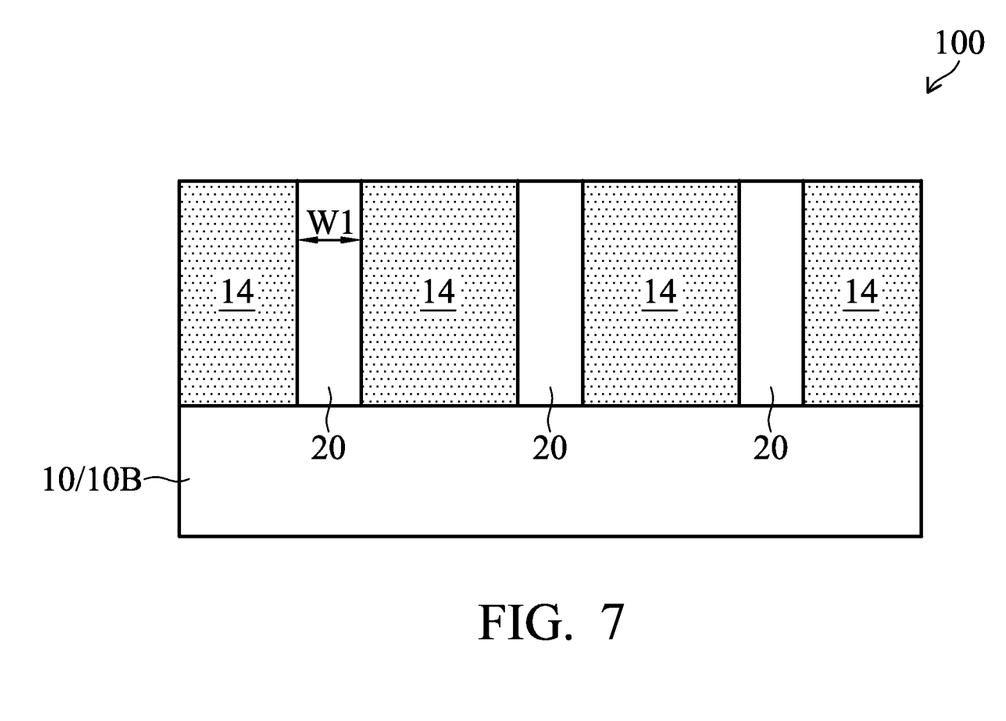

In some embodiments, after the second planarization, STI regions 14 may have top surface 14B that are not flat. Each of top surfaces 14B may have edge portions 14B1 and a center portion 14B2, wherein edge portions 14B1 are on opposite sides of, and may encircle, center portion 14B2. Center portion 14B2 may be higher than edge portions 14B1, and from the center point 15 of top surface 14B to edge portions, the height of top surfaces 14B may reduce gradually. Top surfaces 14B may be further flattened through an etching step. In some exemplary embodiments, the etching is performed using a Hydrogen Fluoride (HF) containing etchant, which may include, for example, a diluted HF solution, although an HF gas and/or other etchant that does not attack semiconductor strips 20 may also be used. During the etch step, center portion 14B2 have a greater etching rate than edge portions 14B1, and hence the height difference between center portion 14B2 and edge portions 14B 1 is reduced. The height difference is increasingly reduced over the etching time, and by selecting an appropriate stop point of the etching process, center portion 14B2 and edge portions 14B1 may have substantially the same height, and top surface 14B may be substantially flat. The resulting structure is shown in FIG. 7. The difference in the etching rates of center portion 14B2 and edge portions 14B1 may be due to the material difference caused by the diffusion of the materials of STI regions 14 into the edge portions 14B1, but not the center portions.

Figure 8:
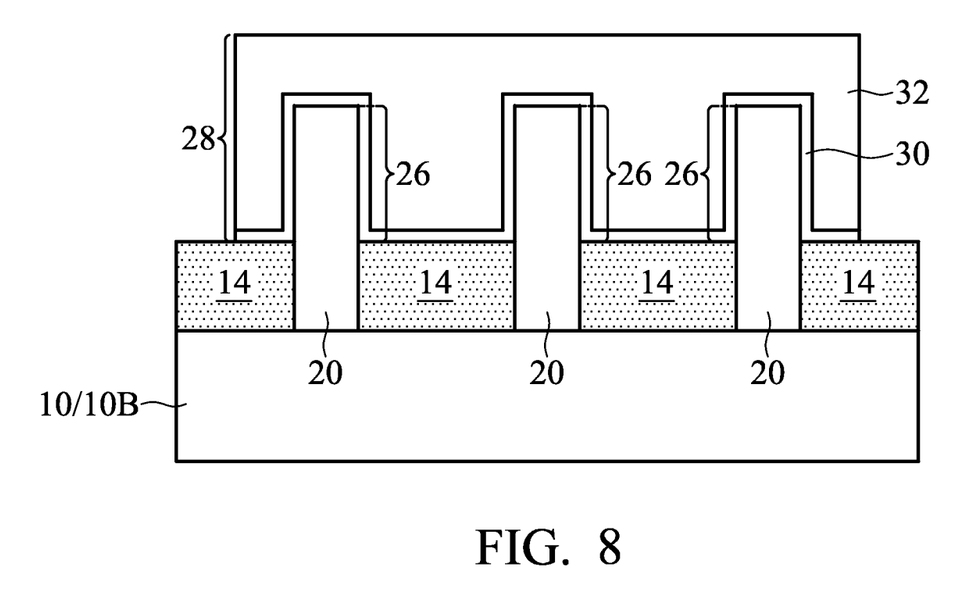

Referring to FIG. 8, STI regions 14 are recessed, for example, through an etching step. Portions of semiconductor strips 20 are thus higher than the top surfaces of STI regions 14. These portions of semiconductor strips 20 thus form semiconductor fins 26, which may be used to form FinFET 28, as shown in FIG. 8. Gate dielectric 30 and gate electrode 32 are then formed. Gate dielectric 30 may be formed of a dielectric material such as silicon oxide, silicon nitride, an oxynitride, multi-layers thereof, and combinations thereof. Gate dielectric 30 may also comprise high-k dielectric materials. The exemplary high-k materials may have k values greater than about 4.0, or even greater than about 7.0. Gate electrode 32 may be formed of doped polysilicon, metals, metal nitrides, metal silicides, and the like. The bottom ends of gate dielectric 30 may contact the top surface of STI regions 14. After the formation of gate dielectric 30 and gate electrode 32, source and drain regions (not shown in FIG. 8) may be formed.

Figure 10:
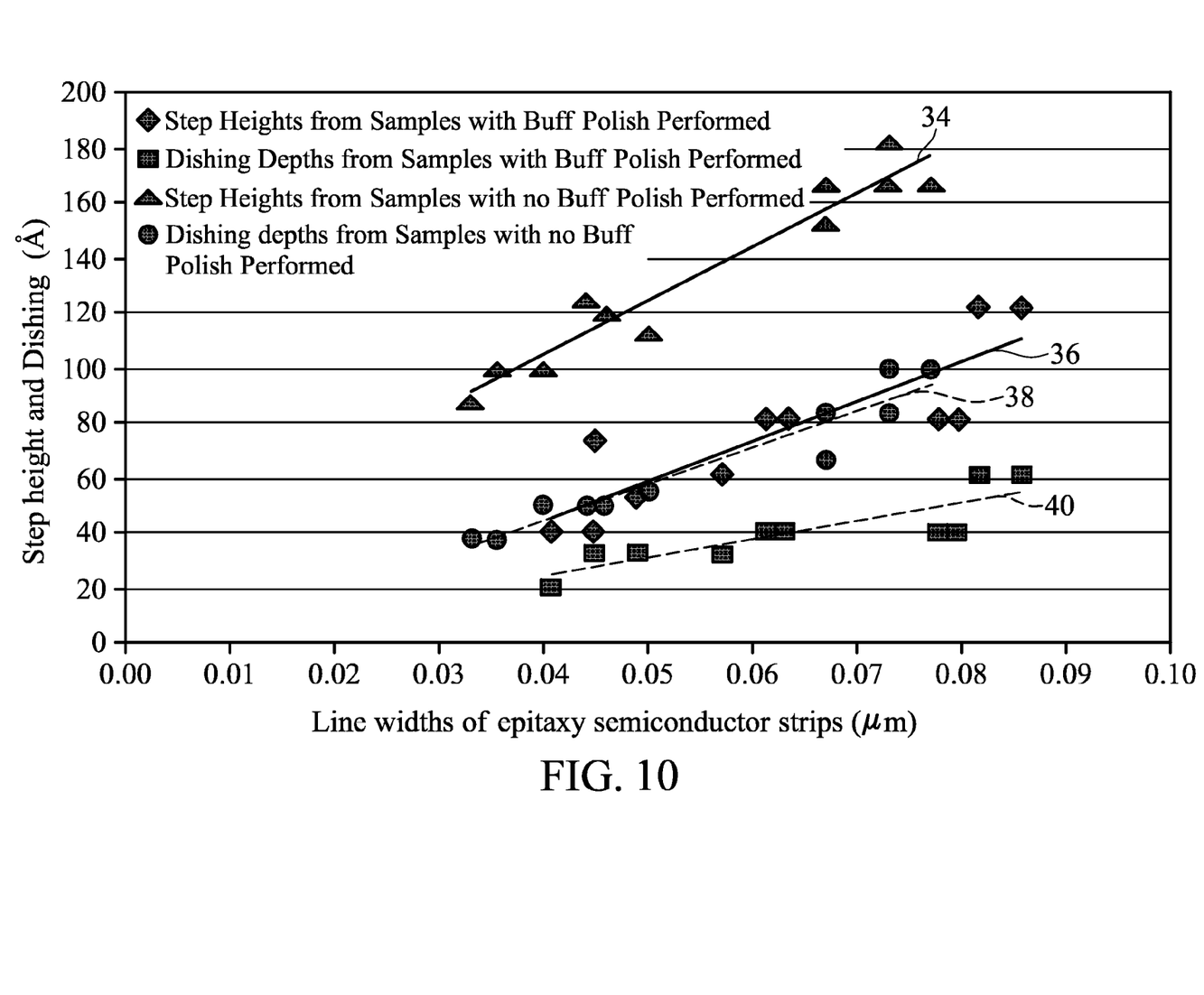
FIG. 10 illustrates step heights and dishing values as functions of line widths of the epitaxy semiconductor strips.

In the embodiments of the present disclosure, through two planarization steps that have different etching selectivity values, the resulting semiconductor fins 26 (FIG. 8) have flat top surfaces, which result in improved performance of the resulting FinFETs. In addition, the buff step in FIG. 5 helps reduce particles and residue of semiconductor regions 18, if any, that are left on STI regions 14. FIG. 10 illustrates experiment results measured from samples. The Y axis is either the step height or the dishing values, wherein lines 34 and 36 are step heights, and lines 38 and 40 are dishing values. The X axis illustrates the width W1 (FIG. 7) of semiconductor strips 20. Line 34 shows the step heights measured from samples on which no buff process is performed, and line 36 shows the step heights measured from samples on which the buff process is performed. It is observed that when line widths are the same, the step heights of the samples that formed using the buff process are smaller than the step heights of the samples that do not experience the buff process. Similarly, line 38 shows the dishing depths measured from the samples on which no buff process is performed, and line 40 shows the dishing depths measured from the samples on which buff process is performed. It is observed that when line widths are the same, the dishing depths of the samples that formed using the buff process are smaller than the dishing depths of the samples that do not experience the buff process.

In accordance with some embodiments, a method includes performing a first planarization step to remove portions of a semiconductor region over isolation regions. The first planarization step has a first selectivity, with the first selectivity being a ratio of a first removal rate of the semiconductor region to a second removal rate of the isolation regions. After the isolation regions are exposed, a second planarization step is performed on the isolation regions and a portion of the semiconductor region between the isolation regions. The second planarization step has a second selectivity lower than the first selectivity, with the second selectivity being a ratio of a third removal rate of the portion of semiconductor region to a fourth removal rate of the isolation regions.

In accordance with other embodiments, a method includes recessing a portion of a semiconductor substrate to form a trench, wherein the portion of the semiconductor substrate is between STI regions. An epitaxy is performed to grow a semiconductor region in the trench. The epitaxy is continued to grow the semiconductor region until a top surface of the semiconductor region is higher than top surfaces of the STI regions. A first CMP is performed on the semiconductor region using a first slurry, wherein the first CMP stops after the top surfaces of the STI regions are exposed. After the first CMP, a second CMP is performed on the STI regions and a portion of the semiconductor region between the STI regions, wherein the second CMP is performed using a second slurry different from the first slurry.

In accordance with yet other embodiments, a method includes recessing a portion of a semiconductor substrate to form a trench, wherein the portion of the semiconductor substrate is between STI regions. An epitaxy is performed to grow a semiconductor region in the trench, until the semiconductor region includes portions over top surfaces of the STI regions. A first CMP is performed on the semiconductor region, wherein the portions of the semiconductor region over the top surfaces of the STI regions are removed, and wherein a portion of the semiconductor region between the STI regions remains to form a semiconductor strip. The semiconductor strip has a dishing depth. After the first CMP, a second CMP is performed, wherein the dishing depth is reduced after the second CMP.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   performing a first planarization step to remove portions of a semiconductor region over isolation regions, wherein the first planarization step has a first selectivity, with the first selectivity being a ratio of a first removal rate of the semiconductor region to a second removal rate of the isolation regions, wherein the first planarization step is finished after the isolation regions are exposed; and
   after the isolation regions are exposed, performing a second planarization step on the isolation regions and a portion of the semiconductor region between the isolation regions, wherein the second planarization step has a second selectivity lower than the first selectivity, with the second selectivity being a ratio of a third removal rate of the portion of the semiconductor region to a fourth removal rate of the isolation regions.

2. The method of claim 1, wherein the first selectivity and the second selectivity have a difference greater than about 2.

3. The method of claim 1, wherein at a time the second planarization step is started, dishing is generated at top surfaces of remaining portions of the semiconductor region, and wherein the remaining portions of the semiconductor regions are between opposite portions of the isolation regions.

4. The method of claim 1 further comprising, before the first planarization step:
   removing a semiconductor region between the isolation regions to form a trench; and
   performing an epitaxy to grow the semiconductor region in the trench, wherein the semiconductor region further comprises portions overlapping the isolation regions.

5. The method of claim 1 further comprising monitoring a motor torque of a polish pad used in the first planarization step to determine a stop point of the first planarization step.

6. The method of claim 1 further comprising, after the second planarization step, etching top surfaces of the isolation regions using an etchant comprising Hydrogen Fluoride (HF), wherein after the top surfaces of the isolation regions are etched, the top surface of the isolation regions are flattened.

7. The method of claim 1 further comprising:
   after the second planarization step, removing top portions of the isolation regions, wherein the portion of the semiconductor region forms a semiconductor fin higher than top surfaces of remaining portions of the isolation regions;
   forming a gate dielectric on a top surface and sidewalls of the semiconductor fin; and
   forming a gate electrode over the gate dielectric.

8. A method comprising:
   recessing a portion of a semiconductor substrate to form a trench, wherein the portion of the semiconductor substrate is between Shallow Trench Isolation (STI) regions;
   performing an epitaxy to grow a semiconductor region in the trench;

continuing the epitaxy to grow the semiconductor region until a top surface of the semiconductor region is higher than top surfaces of the STI regions;

performing a first Chemical Mechanical Polish (CMP) on the semiconductor region using a first slurry, wherein the first CMP stops after the top surfaces of the STI regions are exposed; and after the first CMP, performing a second CMP on the STI regions and a portion of the semiconductor region between the STI regions, wherein the second CMP is performed using a second slurry different from the first slurry.

9. The method of claim 8, wherein the first CMP has a first selectivity, the second CMP has a second selectivity smaller than the first selectivity, with the first selectivity being a ratio of a first removal rate of the semiconductor region to a second removal rate of the STI regions, and the second selectivity being a ratio of a third removal rate of the portion of the semiconductor region to a fourth removal rate of the STI regions.

10. The method of claim 9, wherein the first selectivity is greater than about 10, and the second selectivity is smaller than 10.

11. The method of claim 9, wherein the second selectivity is close to 1.

12. The method of claim 8, wherein the epitaxy comprises epitaxially growing a semiconductor material selected from the group consisting essentially of silicon germanium, substantially pure germanium, and a III-V compound semiconductor material.

13. The method of claim 8 further comprising monitoring a motor torque of a polish pad used in the first CMP to determine a stop point of the first CMP.

14. A method comprising:

recessing a portion of a semiconductor substrate to form a trench, wherein the portion of the semiconductor substrate is between Shallow Trench Isolation (STI) regions;

performing an epitaxy to grow a semiconductor region in the trench, until the semiconductor region comprises portions over top surfaces of the STI regions;

performing a first Chemical Mechanical Polish (CMP) on the semiconductor region, wherein the portions of the semiconductor region over the top surfaces of the STI regions are removed, wherein a portion of the semiconductor region between the STI regions remains to form a semiconductor strip, and wherein the semiconductor strip has a dishing depth; and after the first CMP, performing a second CMP, wherein the dishing depth is reduced after the second CMP.

15. The method of claim 14, wherein after the second CMP, the dishing depth is reduced to substantially equal to zero.

16. The method of claim 14, wherein the first CMP has a first selectivity, the second CMP has a second selectivity smaller than the first selectivity, with the first selectivity being a ratio of a first removal rate of the semiconductor region to a second removal rate of the STI regions, and the second selectivity being a ratio of a third removal rate of the semiconductor strip to a fourth removal rate of the STI regions.

17. The method of claim 16, wherein the first selectivity is greater than about 10, and the second selectivity is smaller than 10.

18. The method of claim 16, wherein the second selectivity is close to 1.

19. The method of claim 14, wherein the epitaxy comprises epitaxially growing a semiconductor material selected from the group consisting essentially of silicon germanium, substantially pure germanium, and a III-V compound semiconductor material.

20. The method of claim 14, wherein after the second CMP, a top surface of one of the STI regions has a center portion and edge portions lower than the center portion, and wherein the method further comprises, after the second CMP, etching the STI regions using an etchant comprising Hydrogen Fluoride (HF), wherein after the STI regions are etched, the top surface of the one of the STI regions is substantially flat.

* * * * *